United States Patent [19]
Fleming et al.

[11] Patent Number: 5,418,463
[45] Date of Patent: May 23, 1995

[54] DETECTION OF ARCS IN POWER CABLES USING PLASMA NOISE OR NEGTIVE RESISTANCE OF THE ARCS

[75] Inventors: Debra A. Fleming, Lake Hiawatha; George E. Peterson, Warren, both of N.J.

[73] Assignee: AT&T Corp., Murray Hill, N.J.

[21] Appl. No.: 157,857

[22] Filed: Nov. 24, 1993

[51] Int. Cl.⁶ ............................................. G01R 31/02
[52] U.S. Cl. .................... 324/520; 324/536; 324/543; 361/113; 340/635
[58] Field of Search ............... 324/520, 536, 543, 544, 324/551, 102, 158 MG, 772; 361/14, 49, 50, 111, 113, 115; 340/635, 649, 650

[56] References Cited

U.S. PATENT DOCUMENTS

| | | | |
|---|---|---|---|
| 4,835,648 | 5/1989 | Yamauchi | 361/115 |
| 5,047,724 | 9/1991 | Boksiner et al. | 324/520 |

OTHER PUBLICATIONS

T. Takukura et al, "Radiation of Plasma Noise from Arc Discharge," *Journal of Applied Physics*, vol. 26, No. 2, Feb. 1955, pp. 185–189.

*Primary Examiner*—Kenneth A. Wieder
*Assistant Examiner*—Diep Do
*Attorney, Agent, or Firm*—Oleg E. Alber

[57] ABSTRACT

A process for detecting arc discharges in power cables connecting power supply board and at least one equipment rack, the power supply board including circuit breakers operable at a preset current level, said arc discharge occurring at a fraction of said current level. After the arc discharge is detected, a signal representing the presence of the arc discharge is supplied to a power supply control, and a control signal is provided by the power supply control to cause said at least one circuit breaker to open interrupting supply of power to an affected power cable.

5 Claims, 5 Drawing Sheets

DETECTION OF ARCS IN POWER CABLES USING PLASMA NOISE OR NEGTIVE RESISTANCE OF THE ARCS

TECHNICAL FIELD

This invention concerns detection of arcs in power cables supplying power for equipment within an office, such as a central telephone exchange office.

BACKGROUND OF THE INVENTION

Central telephone exchange offices utilize DC power to run various telephone communication equipment. DC power is brought into the office to a main switch (or power supply) board from where it is directed to various equipment by power cables. The separation between the main switch board and the power cables is provided typically by DC circuit breakers intended to shut down the equipment in case of short circuits.

Very often an arcing arises between conductors in the cable which if undetected leads to a fire first hidden inside the cable cover and subsequently to an observable fire consuming the cable. Arc discharges within a cable may arise due to a number of factors one of which could be a fault in the insulation on separate conductors in a multiconductor cable. Such a fault could be a result of a manufacturing flaw or damage to the conductor within the cable. Such damage may occur in the course of transportation, installation or use of the cable. Stepping on, kicking or some other damaging act to the cable either during the installation or use in the office may be a contributory cause of the injury.

Arc discharges which may begin as an occasional sparking between adjoining conductors within the cable, if undetected, may lead to a fire within the cable. Arc discharges occur at relatively low current levels of from 0.5 to 10 amperes. However, a typical central office circuit breaker operates at 40–50 ampere level. Thus, the circuit breakers do not recognize such arc discharges permitting the arc discharges to continue with resultant overheating of the cable leading to a fire of the cable and consequently in the central office.

It is desirable to timely detect occurrence of arc discharges in DC power cable and to shut down the equipment prior to occurrence of such arc discharges which could lead to cable fires.

SUMMARY OF THE INVENTION

This invention embodies a process for detecting arc discharges in power cables connecting power supply board and at least one equipment rack, the power supply board including circuit breakers operable at a certain current level, said arc discharge occurring at a fraction of said current level. After the arc discharge is detected, a signal representing the presence of the arc discharge is supplied to a power supply control, and a control signal is provided by the power supply control to cause said at least one circuit breaker to open interrupting supply of power to an affected power cable.

DETAILED DESCRIPTION

DC arcs have characteristics by which they could be recognized and in response to this recognition circuit breakers could be operated which would cause shut off supply of power to the affected power cable. Two of these characteristics are identified as a plasma noise and a negative resistance. Electronic circuits that recognize either one or both of these characteristics can be used to affect the circuit breakers and to prevent fires.

DC arc discharges at atmospheric pressure radiate an intense radio noise equivalent to thermal radiation of $10^6$–$10^7$ K. Strong radiation at a variety of frequencies may be found from these discharges, for example 1 MHz, 10 MHz, 200 MHz and 3 GHz. Radiation at any of these frequencies could be used to affect a circuit breaker. Radiation in the range of 1–2 GHz is most useful because it occurs most often and can be easily detected.

Figure 1:
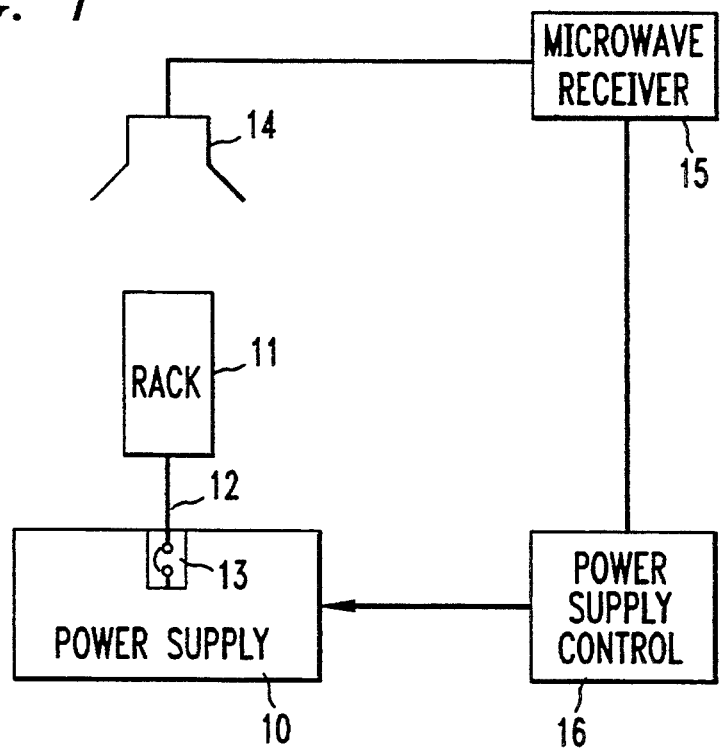
FIG. 1 is a schematic representation of an arc discharge detection system utilizing a microwave horn antenna.

In FIG. 1 is disclosed a schematic representation of a central office arrangement including a power supply board, 10, an electronic equipment, such as an electronic rack, 11, and a power cable, 12, supplying the rack. Power supply board 10 includes a circuit breaker, 13. Suspended above the power line, is a microwave horn antenna, 14, connected to a microwave receiver, 15. The microwave antenna and the microwave receiver survey the power cable for the presence of plasma noise with radio emissions within a prearranged frequency range. Any such emission results in a signal from receiver 15 to a power supply control, 16, which in turn generates a control signal to open circuit breaker, 13, and to interrupt the supply of power to the power cables.

As mentioned earlier arc discharges radiate plasma noise equivalent to thermal radiation of $10^6$–$10^7$ K. A 1 GHz microwave receiver would have a noise figure of about 2. This corresponds to a noise temperature of 290 K. Such a receiver would easily detect the $10^6$–$10^7$ K thermal radiation from an arc.

A Polarad Calibrated Microwave Test Antenna, 1000–2340 MHz, Model CA-W, commercially obtainable from Polarad Electronic Instruments, Lake Success, N.Y., USA, is useful as an exemplary horn antenna 14. An exemplary microwave receiver 15 for use with the above antenna may include three LNG-800 Hamtronics preamplifiers arranged in series and followed by an HP 423B crystal detector. The preamplifiers are commercially obtainable from Hamtronics, Hilton, N.Y., USA and the detector from Hewlett-Packard, Cypetino, Calif., USA. Alternatively, three MAR-8 Mini-Circuits amplifiers, obtainable from Mini-Circuits, Brooklyn, N.Y., USA, may be used instead of the Hamtronics preamplifiers. Another receiver suitable for arc discharge detection is an ICOM R-9000, obtainable from ICOM America, Bellevue, Wash., USA.

Figure 2:
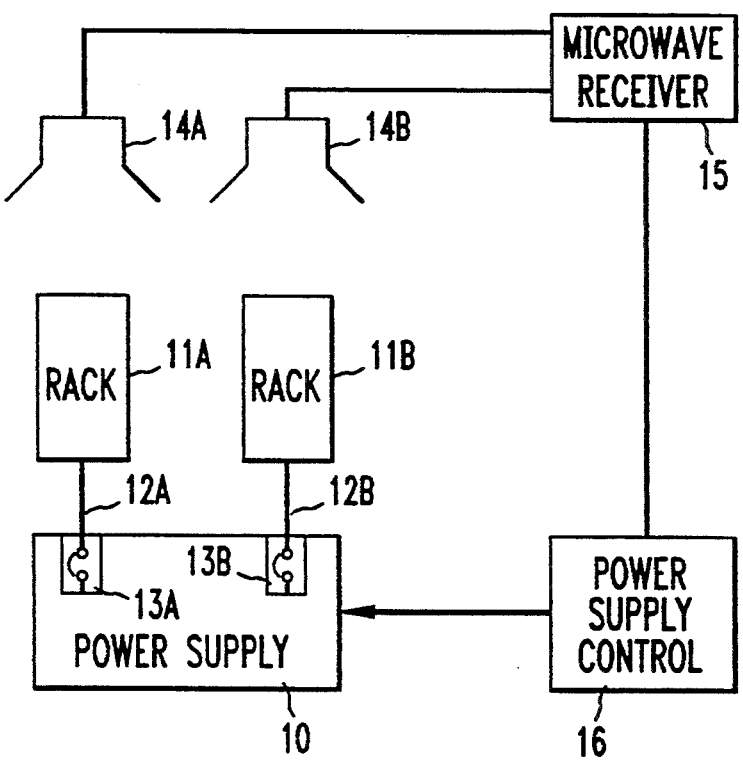
FIG. 2 is a schematic representation of an arc discharge detection system utilizing a plurality of microwave horn antennas for detection of arc discharges in a plurality of power cables.

As is shown in FIG. 2, a central office may include also a plurality of electronic racks, 11A and 11B. Here, respectively, a separate horn antenna, e.g., 14A and 14B, may be provided for each of the individual power cables, 12A and 12B, so that the radiation emission may be detected for each power cable separately and the power may be shut-off only to an affected power cable, retaining the other rack operational. A single microwave receiver 15 may be used which could be programmed in conjunction with the power supply control 16 to shut off power supply to an affected cable only. Alternatively, separate microwave receivers, may be used for each separate horn antenna 14A and 14B, respectively. Also, a single antenna may be used to survey a plurality of power cables and, upon detection of an unwanted radiation emission, to shut off all of the racks.

A "negative resistance" is another of the arc discharge characteristics that may be used to detect an arcing power cable. In order to detect the negative resistance, a tuned circuit is placed across the power cable. The tuned circuit includes a capacitor (C), a resistance (R) and an inductance (L). The tuned circuit has a positive resistance. An active DC arc exhibits a negative resistance, that is, as the voltage across an arc increases, the current drops. An arc violates Ohm's Law. Simply stated Ohm's Law says: the electric current passing through an element is directly proportional to the voltage across it and inversely proportional to its resistance. However, an arc between two electrodes (or two wires) does not behave this way. As the current passing through the arc increases, the voltage between the two electrodes decreases so that the current and the voltage are inversely, not directly, proportional. Thus the arc has a "negative resistance".

If the negative resistance of the arc is added to the positive resistance of a tuned circuit, the circuit will oscillate or generate an excessive noise. This signal can be amplified and detected, and the detected signal can be used to shut-down the supply of power to the power cables.

An exemplary tuned circuit may have a capacitance C within a range from 0.01 microfarad to 100 microfarad, a resistance R within a range of from 1 ohm to 25 ohm, and an inductance L within a range of from 50 microhenries to 100 millihenries. Arcing in a typical power line provided with the tuned circuit would lead to oscillations within a range of from 750 Hz to 10 KHz.

Figure 3:
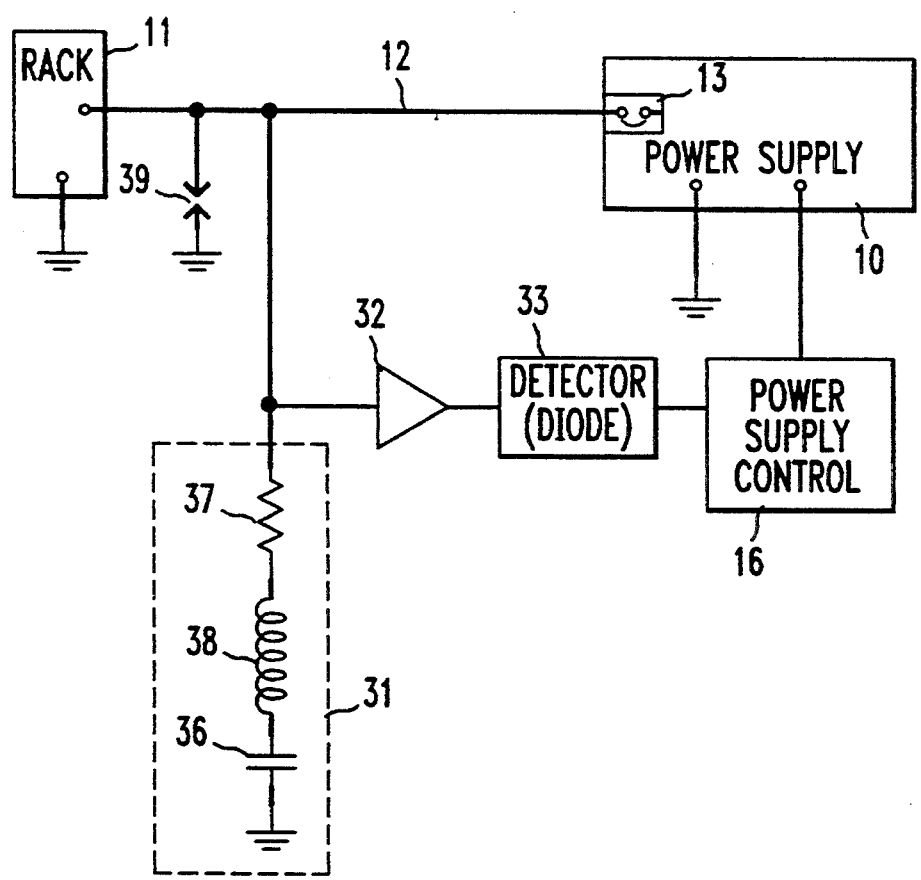
FIG. 3 is a schematic representation of an arc discharge detection system utilizing detection of a negative resistance characteristic of the are discharge.

Shown in FIG. 3 is an arrangement with a power supply 10, an equipment rack, 11, and a power cable, 12. The detection system includes a tuned circuit, 31, a band pass amplifier, 32, and a detector, 33. The tuned circuit includes a capacitor C, 36, a resistance R, 37, and an inductance L, 38, of a loop coupling the tuned circuit to the power cable. Arcing in the cable, at 39, would cause a negative resistance ($R_1$) which when added to the positive resistance (R) of the tuned circuit, would result in a signal which when supplied via a band pass amplifier 32 and detector 33 to a power supply control, 16, shall result in a control signal to open circuit breaker 13 and to interrupt supply of power to the power cable.

Figure 4:
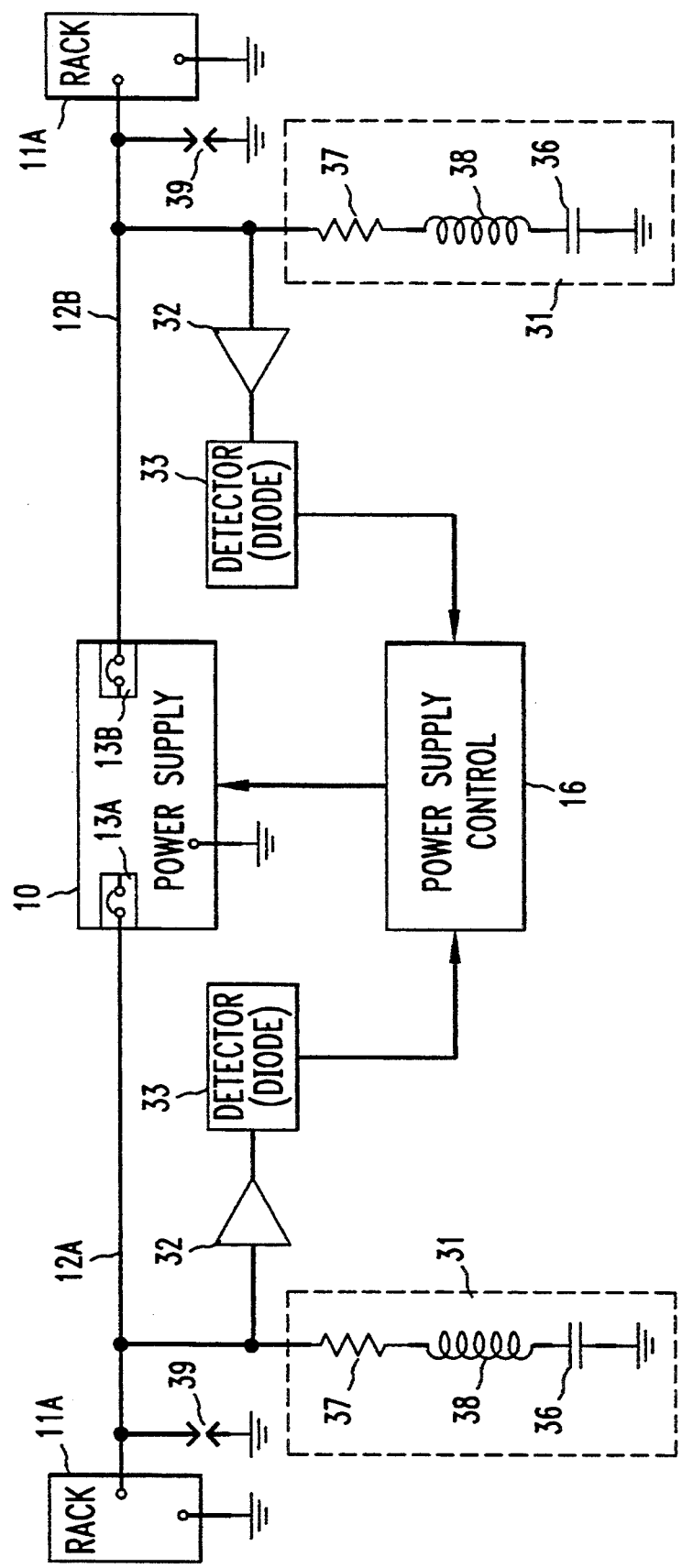
FIG. 4 is a schematic representation of the arc discharge detection system of FIG. 3 for use with a plurality of power cables.

In FIG. 4 is shown an arrangement which includes a plurality of detection systems shown in FIG. 3 and which is designed to overview each one of a plurality of power cables 12A and 12B, separately, provide a signal representative of the presence of an arc in the affected power cable to power supply control 16. The latter in turn provides a control signal to power supply board 10 causing an affected one of the separate circuit breakers 13A and 13B to disconnect supply of power only to the affected power cable. In this manner the remaining equipment rack may continue to remain operational.

The implementation of FIGS. 3 and 4 is useful when there are connection points to which tuned circuit 31 can be coupled. In this implementation the tuned circuit is placed directly across the D.C. power line. This may conveniently be done at one of the connectors to the electronic rack or at a cable junction. However, the preferred location is at some distance (3–20 feet) from the power supply. This minimizes loading or shunting of the arc by the internal impedance of the power supply. If a choke (not shown) is placed in one or both of the leads of the power cable, the sensitivity to arc detection will be improved. Under this circumstance the location of the tuned circuit in the D.C. cable becomes unimportant. The gain of the amplifier should be as high as possible, but not so high that a false shut down of the equipment is likely. This would be the case if the cable was located in a high RF environment. A typical gain for the band pass amplifier would be 20–50 db.

Figure 5:
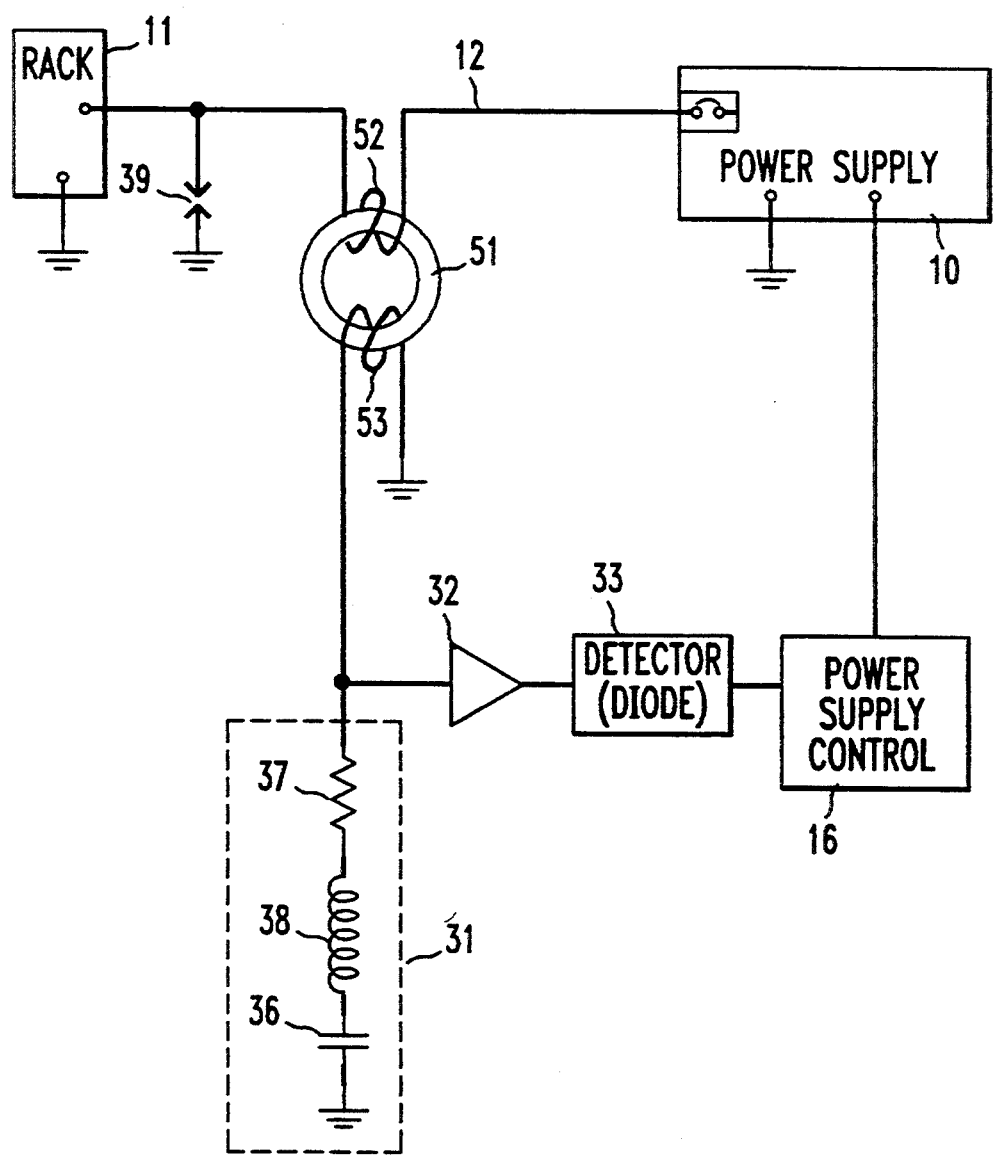
FIG. 5 is a schematic representation of a variant of an arc discharge detection system of FIG. 3.

FIG. 5 is an implementation of a negative resistance detection system that is most useful when one has limited access to a cable connection or when one cannot easily "cut into" the cable. Tuned circuit 31, band pass amplifier 32, detector 33 and power supply control 16 are similar to those shown in FIGS. 3 and 4. However, here one or both leads of cable 12 pass through or encircle a transformer core, 51, as a primary winding, 52. A typical core might be a ferrite or powdered iron toroid. A secondary winding, 53, of the toroid, connected to the tuned circuit, typically gives a 10:1 step-up ratio. Again, a typical gain for the band pass amplifier would be 20–50 db.

An exemplary band pass amplifier for the detection system disclosed in connection with FIGS. 3, 4 and 5 may include two MAR-8 Mini-Circuits amplifiers in series, each of which is preceded by a PLP-5 Mini-Circuits low pass filter. The output of the amplifiers is fed to an HP 423 B crystal detector. Coupling capacitors (0.001 pfd) are placed between the stages to limit the low frequency response to a few hundred Hz. Another implementation replaces the band pass amplifier with a PALOMAR VLF Converter obtainable from PALOMAR Engineers, Escondido, Calif.

Figure 6:
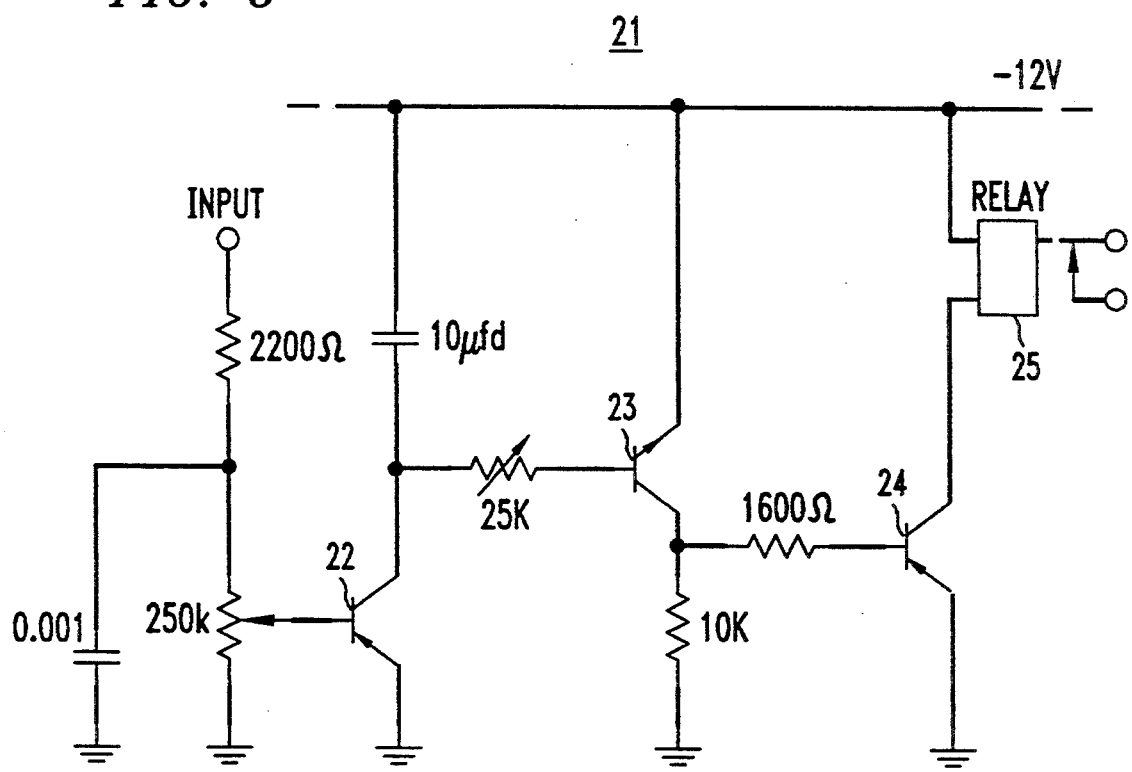
FIG. 6 is a schematic representation of an exemplary circuit utilized for the power supply control.

Power supply control 16 shown in FIG. 1, 2, 3, 4 and 5 utilizes a relay system, 21, which in response to a signal from microwave receiver 15 (FIGS. 1 and 2) or from a detector diode (FIGS. 3, 4 and 5) shall cause circuit breaker 13 or 13A or 13B to open so as to interrupt supply of power from the power supply to a corresponding equipment rack 11. One example of such a circuit for the power supply control is shown in FIG. 6. The signal from the diode detector, which is caused by the arc, may be random, continuous or discontinuous. A first transistor, 22, amplifies the signal. A second transistor, 23, adds some time delay before the third transistor causes relay, 25, to close affecting circuit breaker to break the circuit. The delay ensures that the relay closes only on persistent signals from the arc and not on transient signals from other sources.

The circuit of FIG. 6 is commonly called a carrier operated relay (COR). Other names for a COR are squelch relay, squelch-operated relay, squelch gate or signal-operated relay. COR's, frequently used in FM mobile radio transceivers and commercial units, are available as replacement circuit boards, for example, from MOTOROLA, Phoenix, Ariz.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A method of detecting arc discharges in power cables connecting power supply board and at least one equipment rack, said power supply board including circuit breakers operating at a preset current level, and said arc discharge occurring at a fraction of said current level, which method comprises detecting an arc discharge in at least one power cable, supplying a signal representing the presence of the arc discharge to a power supply control, and providing a control signal from said power supply control sufficient to cause said at least one circuit breaker to open interrupting supply of power from the power supply board to an affected power cable, in which said arc discharge radiates a plasma noise with radio frequency noise, said detecting is conducted by means of a microwave antenna and a microwave receiver which upon detecting said plasma noise provide said arc discharge-representing signal to the power supply control, said microwave antenna being positioned above said at least one power cable and being responsive to radiation in a 1 MHz to 3 GHz frequency range.

2. The method of claim 1 in which a separate microwave antenna is provided for each of a plurality of power cables.

3. The method of claim 1 in which said microwave antenna is responsive to radiation in a 1 to 2 GHz frequency range.

4. A method of detecting arc discharges in power cables connecting power supply board and at least one equipment rack, said power supply board including circuit breakers operating at a preset current level, and said arc discharge occurring at a fraction of said current level, which method comprises detecting an arc discharge in at least one power cable, supplying a signal representing the presence of the arc discharge to a power supply control, and providing a control signal from said power supply control sufficient to cause said at least one circuit breaker to open interrupting supply of power from the power supply board to an affected power cable, in which said arc discharge detection is provided by placing a tuned circuit across said power cable, said tuned circuit including a capacitor (C), a resistance (R) and an inductance connected in series and having a positive resistance, said arc discharge has a negative resistance which counteracts the positive resistance resulting in oscillations or noise of the tuned circuit supplying said signal to the power supply control.

5. The method of claim 4 in which said arc discharge detection is provided for each of a plurality of power cables.

* * * * *